United States Patent
Inoi et al.

[11] Patent Number: 6,097,132
[45] Date of Patent: Aug. 1, 2000

[54] TRANSFORMER WITH THE PIEZOELECTRIC TRANSFORMER ELEMENT HELD BY LEAD TERMINALS AND ELASTIC BODIES IN A CASE

[75] Inventors: Takayuki Inoi; Mitsuhiro Sugimoto; Hiromi Suzuki; Naoto Taihaku, all of Tokyo, Japan

[73] Assignee: NEC Corporation, Tokyo, Japan

[21] Appl. No.: 09/120,502

[22] Filed: Jul. 23, 1998

[30] Foreign Application Priority Data

Aug. 15, 1997 [JP] Japan ................................ 9-220430

[51] Int. Cl.$^7$ .................................................. H01L 41/08
[52] U.S. Cl. ........................ 310/345; 310/348; 310/359; 310/366
[58] Field of Search ................................. 310/346, 348, 310/357–359, 366, 345

[56] References Cited

U.S. PATENT DOCUMENTS

| | | | |
|---|---|---|---|
| 3,622,813 | 11/1971 | Kumon | 310/345 |
| 3,660,699 | 5/1972 | Sakurai et al. | 310/345 |
| 3,662,194 | 5/1972 | Moriki et al. | 310/345 X |
| 3,694,674 | 9/1972 | Inoue | 310/345 X |
| 3,851,194 | 11/1974 | Kawada | 310/345 |
| 4,034,318 | 7/1977 | Ishiyama et al. | 310/345 X |
| 5,747,916 | 5/1998 | Sugimoto et al. | 310/348 |
| 5,847,490 | 12/1998 | Kumasaka et al. | 310/345 X |
| 5,847,491 | 12/1998 | Taihaku et al. | 310/348 X |

FOREIGN PATENT DOCUMENTS

| | | | |
|---|---|---|---|
| 45-9792 | 4/1970 | Japan | 310/345 |
| 6-326371 | 11/1994 | Japan . | |
| 6-342945 | 12/1994 | Japan . | |
| 8-139556 | 5/1996 | Japan . | |
| 8-298213 | 11/1996 | Japan . | |
| 9-36453 | 2/1997 | Japan . | |

*Primary Examiner*—Mark O. Budd
*Attorney, Agent, or Firm*—Sughrue, Mion, Zinn, Macpeak & Seas, PLLC

[57] ABSTRACT

A piezoelectric transformer element includes electrodes formed on a maximum-area of the front surface and rear surface of a long-plate shaped piezoelectric body. A case in which the piezoelectric transformer element is housed includes first lead terminals and second lead terminals. The first lead terminals press the electrodes on the front surface of the piezoelectric transformer element and are electrically connected to the electrodes. The second lead terminals press the electrodes on the rear surface of the piezoelectric transformer element and are electrically connected to the electrodes. The piezoelectric transformer element is held within the case by the first and second lead terminals and ring-shaped elastic bodies in which the piezoelectric transformer element is inserted. Thus, inhibition of vibration of the piezoelectric transformer element is suppressed and energy conversion efficiency of the piezoelectric transformer element is improved.

12 Claims, 13 Drawing Sheets

TRANSFORMER WITH THE PIEZOELECTRIC TRANSFORMER ELEMENT HELD BY LEAD TERMINALS AND ELASTIC BODIES IN A CASE

BACKGROUND OF THE INVENTION

1. Field of the Invention

The present invention relates to a piezoelectric transformer for use in an inverter circuit for a cold cathode tube back light of a liquid crystal panel and various power circuits for generating a high voltage. More particularly, it relates to a piezoelectric transformer which is constituted so that a piezoelectric transformer element is held in a case.

2. Description of the Related Art

A wire-wound electromagnetic transformer has been heretofore used as a transformer element for generating a high voltage in a power circuit in a device requiring a high voltage such as a deflecting device of a television or a charging device of a copier. This electromagnetic transformer is structured in such a manner that a conductor wire is wound around a magnetic core. The achievement of a high transformation ratio requires an increase in the number of turns of the conductor wire wound around the core. It is thus very difficult to miniaturize the electromagnetic transformer.

The electromagnetic transformer is being replaced by a small-sized/high-efficiency piezoelectric transformer. The piezoelectric transformer has a driving unit and a power generating unit. In this piezoelectric transformer, the application of an alternating voltage to the driving unit allows a piezoelectric transformer element to be deformed by an inverse piezoelectric effect. The deformation of the piezoelectric transformer element is then used so as to generate the voltage in the power generating unit by a piezoelectric effect.

Referring to FIG. 1, a symmetrical Rosen tertiary type piezoelectric transformer element 160 is used as the conventional piezoelectric transformer. This symmetrical Rosen tertiary type piezoelectric transformer element 160 is constituted so that electrodes are formed on both surfaces of long-plate shaped piezoelectric body 160a. One end of piezoelectric body 160a is low-impedance driving unit 161a of piezoelectric transformer element 160, while the other end thereof is low-impedance driving unit 161b of piezoelectric transformer element 160.

Input electrode 111 is formed on the front surface of driving unit 161a. The input electrode (not shown) is formed on the rear surface of driving unit 161a so that it may be opposite to input electrode 111 through driving unit 161a. Input electrode 113 is also formed on the front surface of driving unit 161b. The input electrode (not shown) is formed on the rear surface of driving unit 161b so that it may be opposite to input electrode 113 through driving unit 161b. These driving units 161a and 161b are polarized in the direction of thickness of piezoelectric body 160a.

Band-shaped output electrode 115 is partially formed between input electrode 111 and input electrode 113 on the front surface of piezoelectric body 160a so that it may pass through an intermediate portion between input electrode 111 and input electrode 113. The output electrode (not shown) is also formed on the rear surface of piezoelectric body 160a so that it may be opposite to output electrode 115 through piezoelectric body 160a.

High-impedance power generating unit 162a is provided between input electrode 111 and output electrode 115 on piezoelectric body 160a. High-impedance power generating unit 162b is also provided between input electrode 113 and output electrode 115 on piezoelectric body 160a. Power generating units 162a and 162b are polarized in the direction of paralleled arrangement of input electrode 111, output electrode 115 and input electrode 113, that is, in the longitudinal direction of piezoelectric body 160a.

In piezoelectric transformer element 160, the ends of a lead wire are soldered to node position 117 of vibration of input electrode 111, node position 118 of vibration of output electrode 115 and node position 119 of vibration of input electrode 113. The ends of the lead wire are also soldered to the node position (not shown) of the input electrode opposite to input electrode 111, the node position (not shown) of the output electrode opposite to output electrode 115 and the node position (not shown) of the input electrode opposite to input electrode 113.

The alternating voltage is input between lead wire 123 and lead wire 124, whereby the alternating voltage is applied to input electrodes 111 and 113, the input electrode opposite to input electrode 111 and the input electrode opposite to input electrode 113. Driving units 161a and 161b are thereby driven. Driving units 161a and 161b are driven, whereby the voltage is then generated in power generating units 162a and 162b by the piezoelectric effect of piezoelectric body 160a. On the other hand, lead wire 125 is soldered to output electrode 115 and the output electrode opposite to output electrode 115. The voltage generated in power generating units 162a and 162b is output from between lead wire 125 and lead wire 124. For such a symmetrical Rosen tertiary type piezoelectric transformer element, since the lead wires are connected to the node positions of vibration, a piezoelectric transformer of less loss is thus obtained.

However, when the piezoelectric transformer as shown in FIG. 1 is mass-produced, workability is disadvantageously bad during soldering the lead wire. As a solution to this problem, Japanese Patent Laid-open Publication No. 298213/96 discloses a method of holding the piezoelectric transformer element by the use of a lead terminal having spring-like characteristics. In this method, the piezoelectric transformer element is housed within a case in which the lead terminal having the spring-like characteristics is insert-molded.

Referring to FIG. 2, for the piezoelectric transformer disclosed in Japanese Patent Laid-open Publication No. 298213/96, in the same manner as the piezoelectric transformer element shown in FIG. 1, piezoelectric transformer element 260 comprising input electrode 211, input electrode 213 and output electrode 215 formed on the front surface of the piezoelectric body is used. In the same manner as the piezoelectric transformer element shown in FIG. 1, the input electrodes and output electrode are formed on the rear surface of the piezoelectric body so that they may be opposite to input electrodes 211, 213 and output electrode 215 through the piezoelectric body. Upper lead terminal 203a as a first lead terminal is insert-molded in upper case 202a, while lower lead terminal 203b as a second lead terminal is insert-molded in lower case 202b.

In such a piezoelectric transformer, piezoelectric transformer element 260 is inserted between upper case 202a and lower case 202b, so that upper case 202a is bonded to lower case 202b. In this way, piezoelectric transformer element 260 is housed in the case composed of upper case 202a and lower case 202b.

Referring to FIG. 3, in the piezoelectric transformer assembled by bonding upper case 202a to lower case 202b, input electrode 211 is electrically connected to upper lead terminal 203a on contact point 281a. Input electrode 212 opposite to input electrode 211 through the piezoelectric body is electrically connected to lower lead terminal 203b on contact point 281b. The spring-like characteristics of upper lead terminal 203a and lower lead terminal 203b cause the lead terminals to press piezoelectric transformer element 260. In such a manner, piezoelectric transformer element 260 is held in the case. Protrusion 283a is formed on the inner wall of upper case 202a, while protrusion 283b is formed on the inner wall of lower case 202b. Protrusions 283a and 283b are used for limiting the movement of piezoelectric transformer element 260.

In such a manner, the method of packaging the piezoelectric transformer by holding the piezoelectric transformer element by the spring-like characteristics of the lead terminal is very excellent in assembly and packaging of the piezoelectric transformer element.

The method of packaging the piezoelectric transformer element in the case by the use of an elastic body will be described below. The method using the elastic body is disclosed in Japanese Patent Laid-open Publication No. 36453/97 and Japanese Patent Laid-open Publication No. 342945/94.

Referring to FIG. 4, piezoelectric transformer element 391 of a secondary mode vibration using a horizontal vibration effect is used for the piezoelectric transformer disclosed in Japanese Patent Laid-open Publication No. 36453/97. This piezoelectric transformer causes one end portion of the plain-shaped piezoelectric transformer element 391 to vibrate in its width direction and the other end of piezoelectric transformer element 391 to vibrate in its width direction utilizing the vibration of one end of piezoelectric transformer element 391. The lead wire (not shown) is mounted to the electrode of piezoelectric transformer element 391 on a non-node position of vibration.

Referring to FIG. 5, Rosen secondary type piezoelectric transformer element 401 is used for the piezoelectric transformer disclosed in Japanese Patent Laid-open Publication No. 342945/94. Elastic bodies 402a and 402b are mounted by adhesive to the vibration node positions of piezoelectric transformer element 401. Lead wire 404a is mounted to the electrode on the front surface side of piezoelectric transformer element 401 on the non-node position of vibration. On the other hand, lead wire 404b is mounted to the electrode on the rear surface side of piezoelectric transformer element 401 on the non-node position of vibration. Moreover, lead wire 404c is mounted to the output-side electrode on the end of piezoelectric transformer element 401. The position on piezoelectric transformer element 401 to which lead wire 404c is mounted is also the non-node position of vibration.

This piezoelectric transformer element 401 is housed in case 403. Here, elastic bodies 402a and 402b are bonded on the inner wall of case 403 by the adhesive. In such a manner, piezoelectric transformer element 401 is held in case 403 by elastic bodies 402a and 402b.

For the piezoelectric transformer shown in FIG. 5, more specifically, lead wire 404c mounted to the output electrode on the end of piezoelectric transformer element 401 is mounted on an amplitude portion of vibration of piezoelectric transformer element 401. Therefore, more particularly, lead wire 404c considerably inhibits the vibration of piezoelectric transformer element 401.

The method of packaging the piezoelectric transformer element by the use of the elastic body, an O-ring, will be described below.

Referring to FIG. 6, Rosen secondary type piezoelectric transformer element 511 is used for the piezoelectric transformer disclosed in Japanese Patent Laid-open Publication No. 326371/94. O-ring 512a is mounted by adhesive 513 to the vibration node position of piezoelectric transformer element 511. O-ring 512b is mounted by adhesive 513 to the vibration node position differing from the vibration node position to which O-ring 512a is mounted.

On the other hand, substrate 514 is provided with hooks 515. O-rings 512a and 512b are hooked by hooks 515 corresponding to the respective O-rings. In this way, piezoelectric transformer element 511 is packaged on substrate 514 by O-rings 512a and 512b.

One end of lead wire 516a is mounted, on the non-node position of vibration, to the electrode of piezoelectric transformer element 511 on the opposite surface to substrate 514. One end of lead wire 516b is also mounted, on the non-node position of vibration, to the electrode of piezoelectric transformer element 511 on the same surface as substrate 514. One end of lead wire 516c is then mounted to the output-side electrode on the end of piezoelectric transformer element 511.

In the piezoelectric transformer shown in FIG. 6, in the same manner as the one shown in FIG. 5, lead wire 516c mounted to the output-side electrode on the end of piezoelectric transformer element 511 is mounted on the amplitude portion of vibration. Therefore, more particularly, lead wire 516c considerably inhibits the vibration of piezoelectric transformer element 511.

In a ceramic resonator in which a piezoelectric element is used as a resonator, the method of packaging the piezoelectric element within an elastic frame in which the protrusions are formed on the inner wall thereof will be described below.

Referring to FIG. 7, plate-shaped piezoelectric element 621 utilizing a mode of spread vibration is used for the ceramic resonator disclosed in Japanese Patent Laid-open Publication No. 139556/96. Positioning protrusions 623 are formed on the inner wall of elastic frame 622 for housing piezoelectric element 621. Piezoelectric element 621 is held within frame 622 by positioning protrusions 623. Electrode plates 624a and 624b incorporated in frame 622 are housed within case 625. Electrode plate 624a is arranged on the front surface of piezoelectric element 621, while electrode plate 624b is arranged on the rear surface of piezoelectric element 621. After housing piezoelectric element 621 or the like in case 625, an opening of case 625 is sealed by sealing resin 626.

In the ceramic resonator shown in FIG. 7, the protrusions for positioning piezoelectric element 621 are formed at such positions that they may inhibit the spread vibration of piezoelectric element 621.

However, since the lead wire is soldered to the node position of vibration in the above-described conventional Rosen tertiary type piezoelectric transformer, assembly workability is disadvantageously bad during the mass-production of the piezoelectric transformer.

The case for the piezoelectric transformer disclosed in Japanese Patent Laid-open Publication No. 298213/96 shown in FIGS. 2 and 3 is also provided with the lead terminals for holding the piezoelectric transformer element and the protrusions for limiting the movement of the piezoelectric transformer element. Since the piezoelectric transformer element can be packaged by housing the piezoelectric transformer element in the case, the assembly workability is good. However, the material of protrusions 283a and 283b in the case must be as hard as the material of the case in which they are molded. Therefore, when piezoelectric transformer element 260 comes into contact with protrusions 283a and 283b by an influence such as the vibration or impact, or when piezoelectric transformer element 260 is brought into contact with the case due to a positional shift, vibration characteristics of piezoelectric transformer element 260 are deteriorated and an audible sound region is vibrated. This causes the problem in which the vibration of the audible sound region is transmitted to the case and thus a noise is generated.

In the piezoelectric transformer disclosed in Japanese Patent Laid-open Publication No. 36453/97, Japanese Patent Laid-open Publication No. 342945/94 and Japanese Patent Laid-open Publication No. 326371/94, the elastic body is bonded to the node position of vibration of the piezoelectric transformer element in order to hold the piezoelectric transformer element. The piezoelectric transformer element is then mounted in the case or on the substrate by the elastic body. The lead wire is soldered to the electrode of the piezoelectric transformer element. However, the position to which the lead wire is soldered is the non-node position of vibration of the piezoelectric transformer element, and thus the lead wire cannot be mounted to the node position of vibration. Thus, disadvantageously, the mounting of the lead wire to the non-node position of vibration inhibits the vibration of the piezoelectric transformer element, resulting in the degradation of the vibration characteristics of the piezoelectric transformer element. In addition, the position to which the elastic body for holding the piezoelectric transformer element is mounted is only specified to be the node position of vibration, and the range of the mounting position is not clearly defined. The material of the elastic body is not specified in detail.

Furthermore, in the piezoelectric transformer disclosed in Japanese Patent Laid-open Publication No. 326371/94, the O-rings bonded to the piezoelectric transformer element are hooked by the hooks on the substrate, whereby the piezoelectric transformer element is packaged on the substrate. However, there is concern that vibration, impact or the like will cause the O-rings to be removed from the hooks on the substrate.

In the ceramic resonator disclosed in Japanese Patent Laid-open Publication No. 139556/96 shown in FIG. 7, positioning protrusions 623 on frame 622 are disadvantageously formed at such positions that they may inhibit the vibration of piezoelectric element 621. The shape and position of positioning protrusion 623 are not specified in detail, and the material of elastic frame 622 is not specified in detail.

SUMMARY OF THE INVENTION

It is an object of the present invention to provide a piezoelectric transformer in which a piezoelectric transformer element is housed within a case, which is adapted in such a manner that the piezoelectric transformer element does not come into contact with the case or the like by an influence such as a vibration or an impact so that the vibration characteristics of the piezoelectric transformer element are not deteriorated and an audible sound region is not vibrated.

It is another object of the present invention to provide a piezoelectric transformer in which it is not required to form protrusions on an inner wall of the case in order to limit the movement of the piezoelectric transformer element in the case or to position the piezoelectric transformer element.

In order to achieve the above objects, in the piezoelectric transformer of the present invention, when the piezoelectric transformer element is housed within the case including first and second lead terminals, the piezoelectric transformer element is held by the first and second lead terminals for pressing electrodes of the piezoelectric transformer element and by ring-shaped elastic bodies in which the piezoelectric transformer element is inserted. This suppresses the inhibition of vibration of the piezoelectric transformer element and obtains a piezoelectric transformer having a high energy conversion efficiency. Moreover, even if an external force is applied to the piezoelectric transformer, positional shift of the piezoelectric transformer element within the case is prevented and a highly reliable piezoelectric transformer is obtained. Furthermore, it is not necessary to form the protrusions for limiting the movement of the piezoelectric transformer element in the case or for positioning the piezoelectric transformer element on the inner wall of the case. Accordingly, the piezoelectric transformer element does not come into contact with the case or the like by an influence such as vibration or impact, so that the vibration characteristics of the piezoelectric transformer element are not deteriorated and the audible sound region is not vibrated. As a result, the vibration of the audible sound region is not transmitted to the case, noise is not generated, and thus the low-noise piezoelectric transformer is obtained.

Alternatively, according to the piezoelectric transformer of the present invention, in the above-mentioned piezoelectric transformer, the ring-shaped elastic body is replaced by a holder-shaped elastic body having a concavity in which the end of the piezoelectric transformer is inserted. The piezoelectric transformer element is held in the case by this holder-shaped elastic body and the first and second lead terminals. In such a manner, an effect similar to the effect of the piezoelectric transformer using the aforementioned ring-shaped elastic body is obtained.

The above and other objects, features and advantages of the present invention will become apparent from the following description with reference to the accompanying drawings which illustrate examples of the present invention.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Embodiment 1

Figure 8:
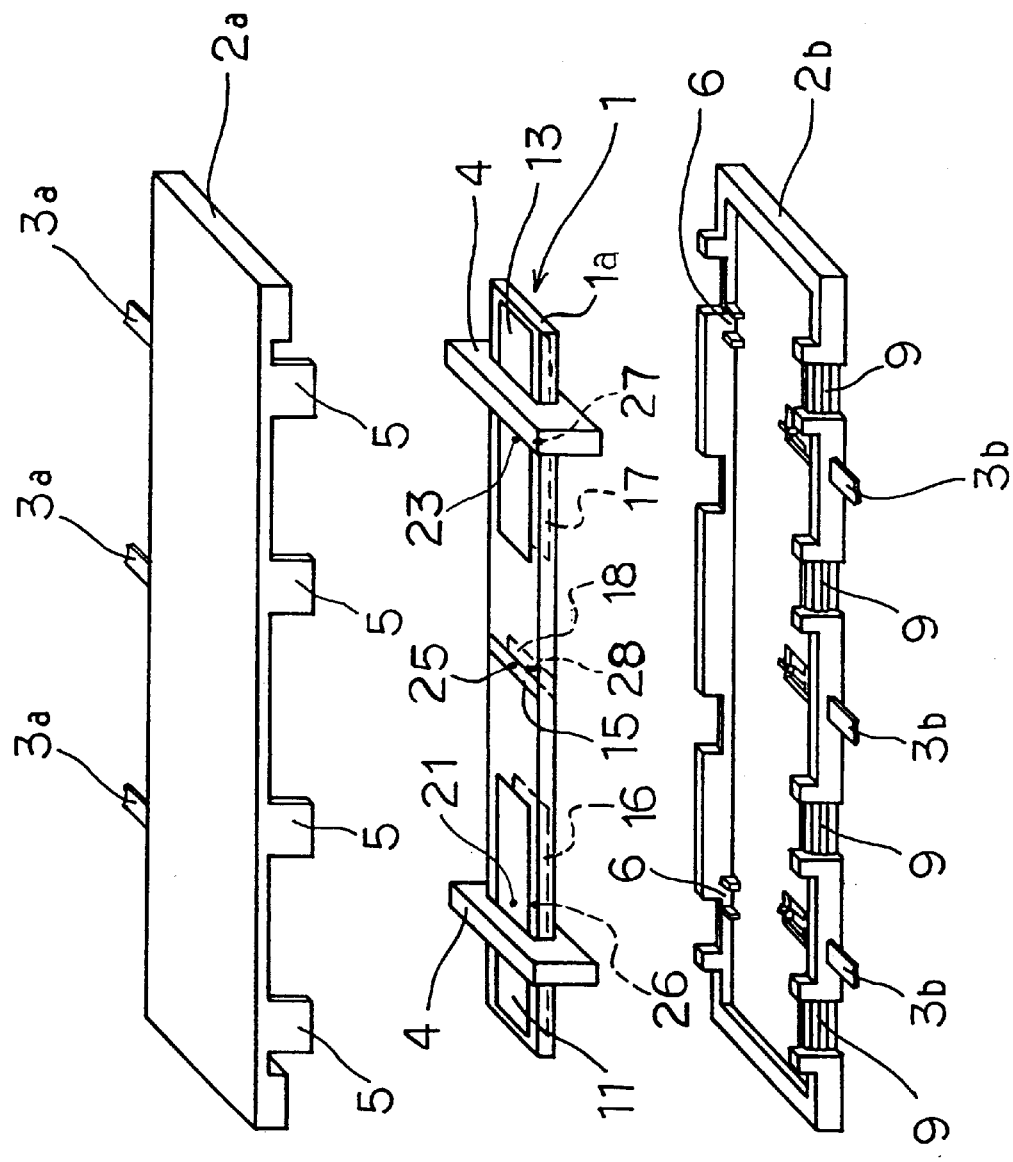
FIG. 8 is an exploded perspective view showing the piezoelectric transformer of a first embodiment of the present invention.

Referring to FIG. 8, in a piezoelectric transformer of a first embodiment of the present invention, input electrode 11, output electrode 15 and input electrode 13 are partially formed on a front surface having a maximum area of long-plate shaped piezoelectric body 1a. The input electrode 16, the output electrode 18 and the input electrode 17 are also formed on the rear surface of piezoelectric body 1a so that they may be opposite to input electrode 11, output electrode 15 and input electrode 13, respectively, through piezoelectric transformer element 1. The input and output electrodes are thus formed on the front and rear surfaces of piezoelectric body 1a, whereby piezoelectric transformer element 1 is constituted.

The substantial center position of input electrode 11 is node position 21 of vibration of piezoelectric transformer element 1, while the substantial center position of input electrode 13 is node position 23 of vibration of piezoelectric transformer element 1. The substantial center position of output electrode 15 is also node position 25 of vibration of piezoelectric transformer element 1.

The substantial center position of input electrode 16 is node position 26 of vibration of piezoelectric transformer element 1, while the substantial center position of input electrode 17 is node position 27 of vibration of piezoelectric transformer element 1. The substantial center position of output electrode 18 is also node position 28 of vibration of piezoelectric transformer element 1.

This piezoelectric transformer element 1 is inserted in ring-shaped elastic bodies 4, and it is then housed within a case composed of upper case 2a and lower case 2b. Upper lead terminals 3a as first lead terminals are insert-molded in upper case 2a. Lower lead terminals 3b as second lead terminals are insert-molded in lower case 2b. Snap fit fingers 5 are formed in upper case 2a, while protrusions 9 are formed in lower case 2b, whereby they may fit to snap fit fingers 5. Snap fit fingers 5 are fitted to protrusions 9 so that piezoelectric transformer element 1 is cased within the case constituted of upper case 2a and lower case 2b.

Grooves 6 for positioning ring-shaped elastic bodies 4 are then formed on an inner wall of lower case 2b. During the housing of piezoelectric transformer element 1, ring-shaped elastic bodies 4 are inserted in grooves 6, whereby ring-shaped elastic bodies 4 are positioned. In this way, piezoelectric transformer element 1 can be held within the case by ring-shaped elastic bodies 4 in such a manner that piezoelectric transformer element 1 is not brought into direct contact with the inner walls of upper case 2a and lower case 2b.

At this time, upper lead terminals 3a corresponding to the respective electrodes are pressed against input electrode 11, output electrode 15 and input electrode 13. Lower lead terminals 3b corresponding to the respective electrodes are also pressed against input electrode 16, output electrode 18 and input electrode 17 on the rear surface of piezoelectric body 1a.

Input electrode 11 comes into contact with upper lead terminal 3a corresponding to input electrode 11 on node position 21, while input electrode 13 comes into contact with upper lead terminal 3a corresponding to input electrode 13 on node position 23. Output electrode 15 also comes into contact with upper lead terminal 3a corresponding to output electrode 15 on node position 25.

Input electrode 16 comes into contact with lower lead terminal 3b corresponding to input electrode 16 on node position 26, while input electrode 17 comes into contact with lower lead terminal 3b corresponding to input electrode 17 on node position 27. Output electrode 18 also comes into contact with lower lead terminal 3b corresponding to output electrode 18 on node position 28.

Upper lead terminals 3a and lower lead terminals 3b press piezoelectric transformer element 1 in such a manner, whereby piezoelectric transformer element 1 is held within the case. Therefore, piezoelectric transformer element 1 is held within the case by ring-shaped elastic bodies 4, upper lead terminals 3a and lower lead terminals 3b. Thus, even if an external force is applied to the piezoelectric transformer, piezoelectric transformer element 1 is not brought into contact with the case. As a result, the vibration of piezoelectric transformer element 1 is not inhibited, and noise is not generated.

Components for use in the piezoelectric transformer of this embodiment will be described in detail below.

Figure 1:
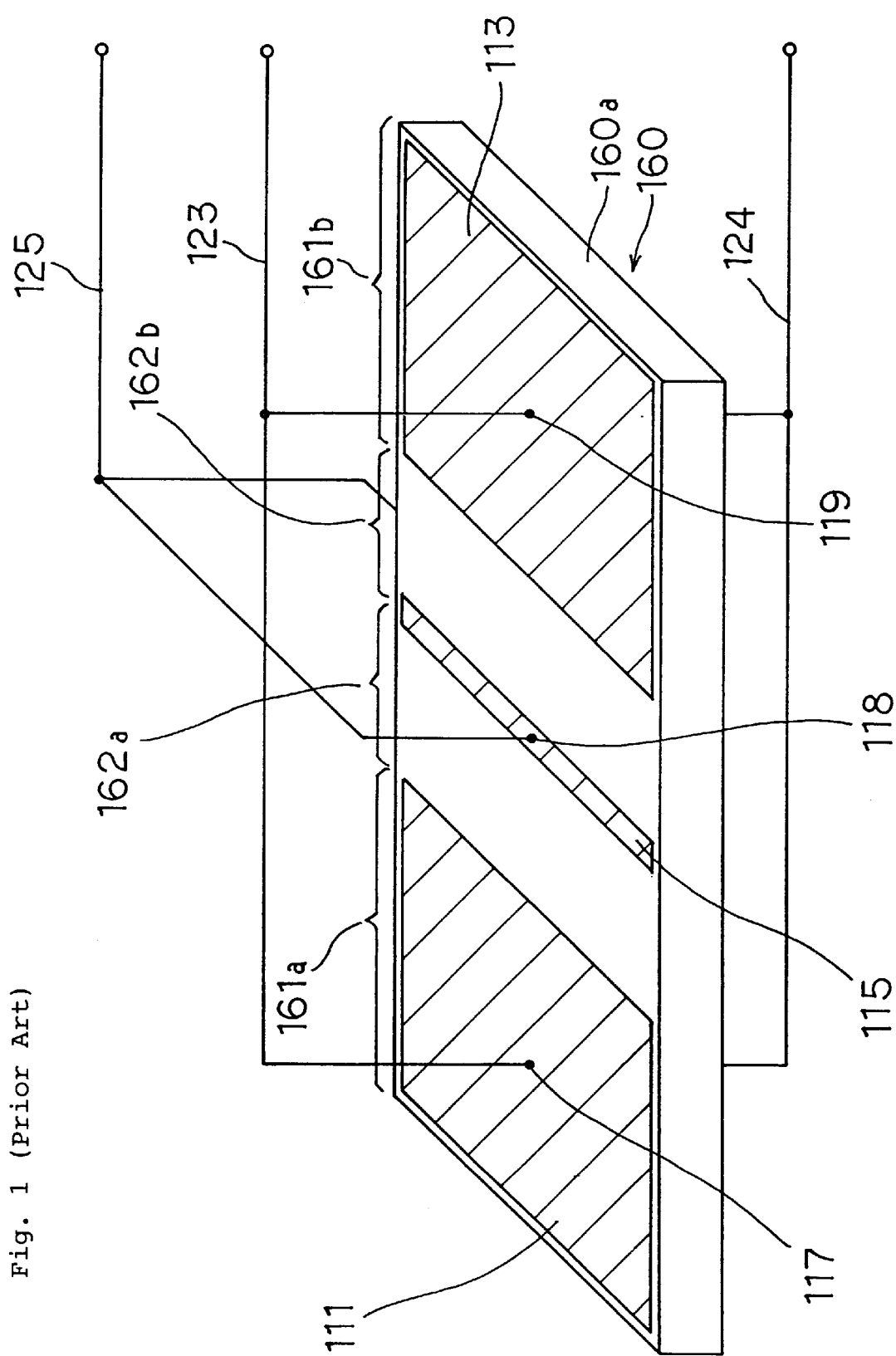
FIG. 1 is a perspective view for describing the prior-art piezoelectric transformer.

The external dimensions of piezoelectric transformer element 1 are L=42 mm in length, W=5.5 mm in width and T=1 mm in thickness. This piezoelectric transformer element 1 is similar to the prior-art symmetrical tertiary Rosen type piezoelectric transformer element shown in FIG. 1. The driving frequency of piezoelectric transformer element 1 is 115 kHz.

Liquid crystal polymer, Zenite 130 (trade name, available from E. I. du Pont de Nemours and Company (the DuPont Company)) is used as a mold material of upper case 2a and lower case 2b. When upper case 2a is combined with lower case 2b, the external dimensions of the case are L=44.4 mm in length, W=11.8 mm in width and T=3.2 mm in thickness.

Figure 9A:
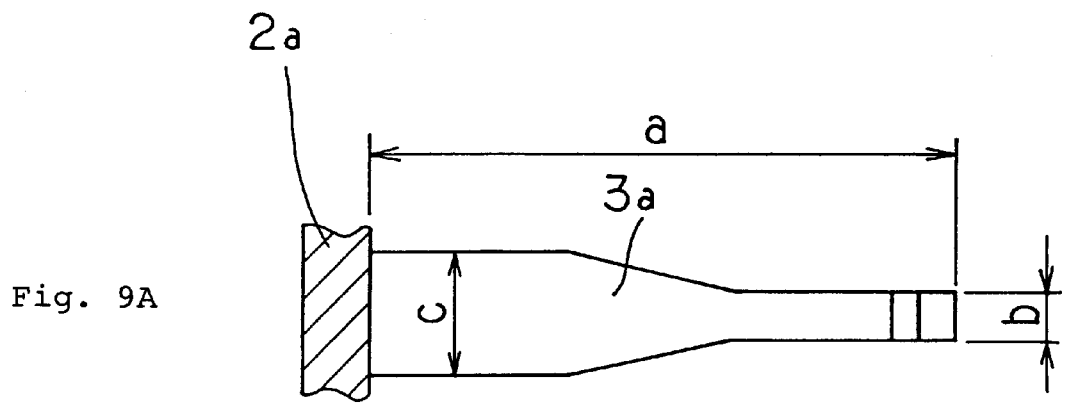
FIG. 9A is a plan view of an upper lead terminal shown in FIG. 8.

Referring to FIG. 9A, the dimensions of upper lead terminal 3a are a=5.1 mm in length between the inner wall of upper case 2a and the tip end of upper lead terminal 3a and b=0.4 mm in width of the tip end thereof. Width c of a portion of upper lead terminal 3a insert-molded in upper case 2a is increased up to 1.0 mm in order to have strength as a spring material.

Figure 9B:
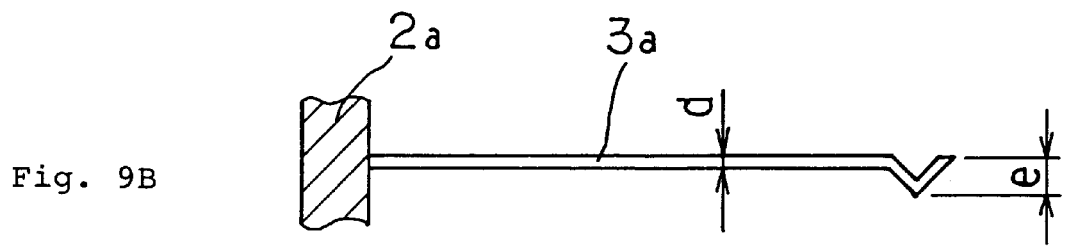
FIG. 9B is a side view of the upper lead terminal shown in FIG. 8.

Referring to FIG. 9B, upper lead terminal 3a has plate thickness d of 0.1 mm, and upper lead terminal 3a has difference e in depth of 0.45 mm on the tip end thereof. Difference e in depth includes plate thickness d of upper lead terminal 3a.

Figure 10A:
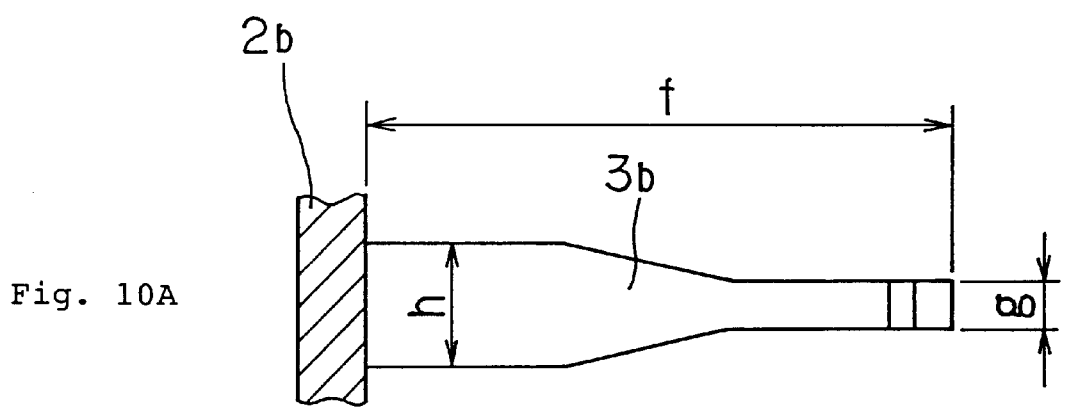
FIG. 10A is a plan view of a lower lead terminal shown in FIG. 8.

Referring to FIG. 10A, the dimensions of lower lead terminal 3b are f=5.1 mm in length between the inner wall of lower case 2b and the tip end of lower lead terminal 3b and g=0.4 mm in width of the tip end thereof. Width h of a portion of lower lead terminal 3b insert-molded in lower case 2b is increased up to 1.0 mm in order to have the strength as the spring material.

Figure 10B:
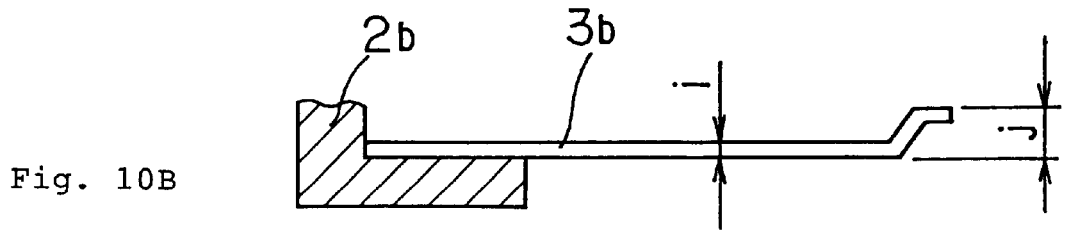
FIG. 10B is a side view of the lower lead terminal shown in FIG. 8.

Referring to FIG. 10B, lower lead terminal 3b has plate thickness i of 0.1 mm, and lower lead terminal 3b has difference j in depth of 0.45 mm on the tip end thereof. Difference j in depth includes plate thickness i of lower lead terminal 3b.

Phosphor bronze (C-5210H material) is used as the material of upper lead terminal 3a and lower lead terminal 3b. The lead terminals are plated with nickel of 2–5 μm thick on the front surfaces thereof.

As described above, the portions, where upper lead terminals 3a and lower lead terminals 3b are in contact with piezoelectric transformer element 1, are positioned on the nodes of vibration of piezoelectric transformer element 1. A contact length of upper lead terminal 3a is equal to 0.4 mm, namely, width b of the tip end of upper lead terminal 3a. Contact area S of lower lead terminal 3b is equal to 0.25 mm$^2$. In order to bring upper lead terminals 3a and lower lead terminals 3b into contact with piezoelectric transformer element 1, a stroke for forcing the lead terminals is set to about 0.1 mm. The force for pressing the lead terminals is set to 50–60 gf.

Figure 11:
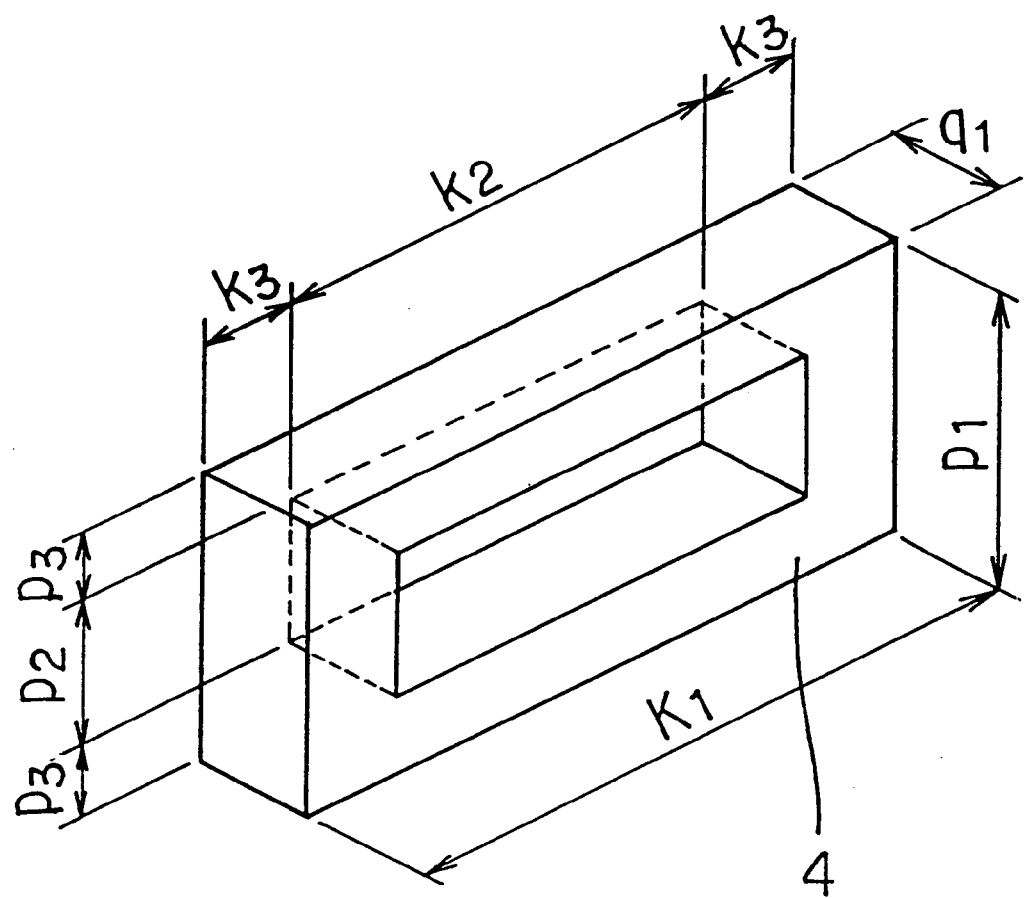
FIG. 11 is a perspective view showing a ring-shaped elastic body shown in FIG. 8.

FIG. 11 is a perspective view showing ring-shaped elastic body 4 shown in FIG. 8. As shown in FIG. 11, the external dimensions of ring-shaped elastic body 4 are $k_1$=9.5 mm in length, $p_1$=2 mm in height and $q_1$=9.5 mm in width. Width $q_1$ is equal to the width of ring-shaped elastic body 4 in the direction in which piezoelectric transformer element 1 is inserted in ring-shaped elastic body 4. A hole of ring-shaped elastic body 4 in which piezoelectric transformer element 1 is inserted is shaped so that it may be $k_2$=5.5 mm in length and $p_2$=1 mm in height. This hole has width $k_3$ of 2 mm and width $p_3$ of 0.5 mm. Silicon-family rubber material whose hardness is 30° in conformity with JIS (Japanese Industrial Standards) K 6253 is used as the material of ring-shaped elastic body 4. The position, at which ring-shaped elastic body 4 is mounted to piezoelectric transformer element 1, is set so that it may be within a range of 3 mm or less from the node position of vibration.

For the piezoelectric transformer composed of the above-mentioned components, a noise level evaluation, an electrical characteristics evaluation, vibration and impact tests and a reliability evaluation were performed. The results are as described below.

Figure 2:
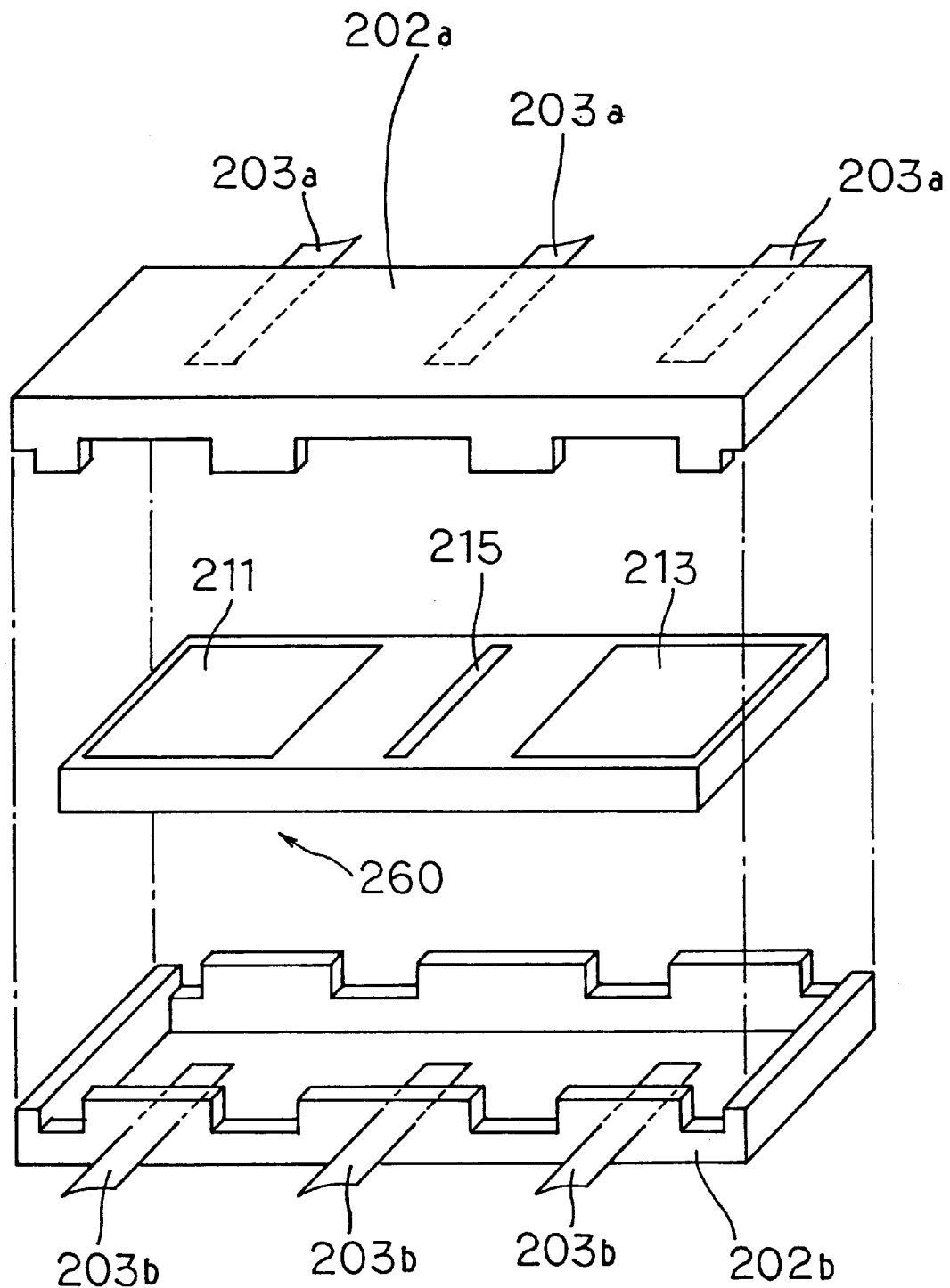
FIG. 2 is an exploded perspective view showing the prior-art piezoelectric transformer.
Figure 3:
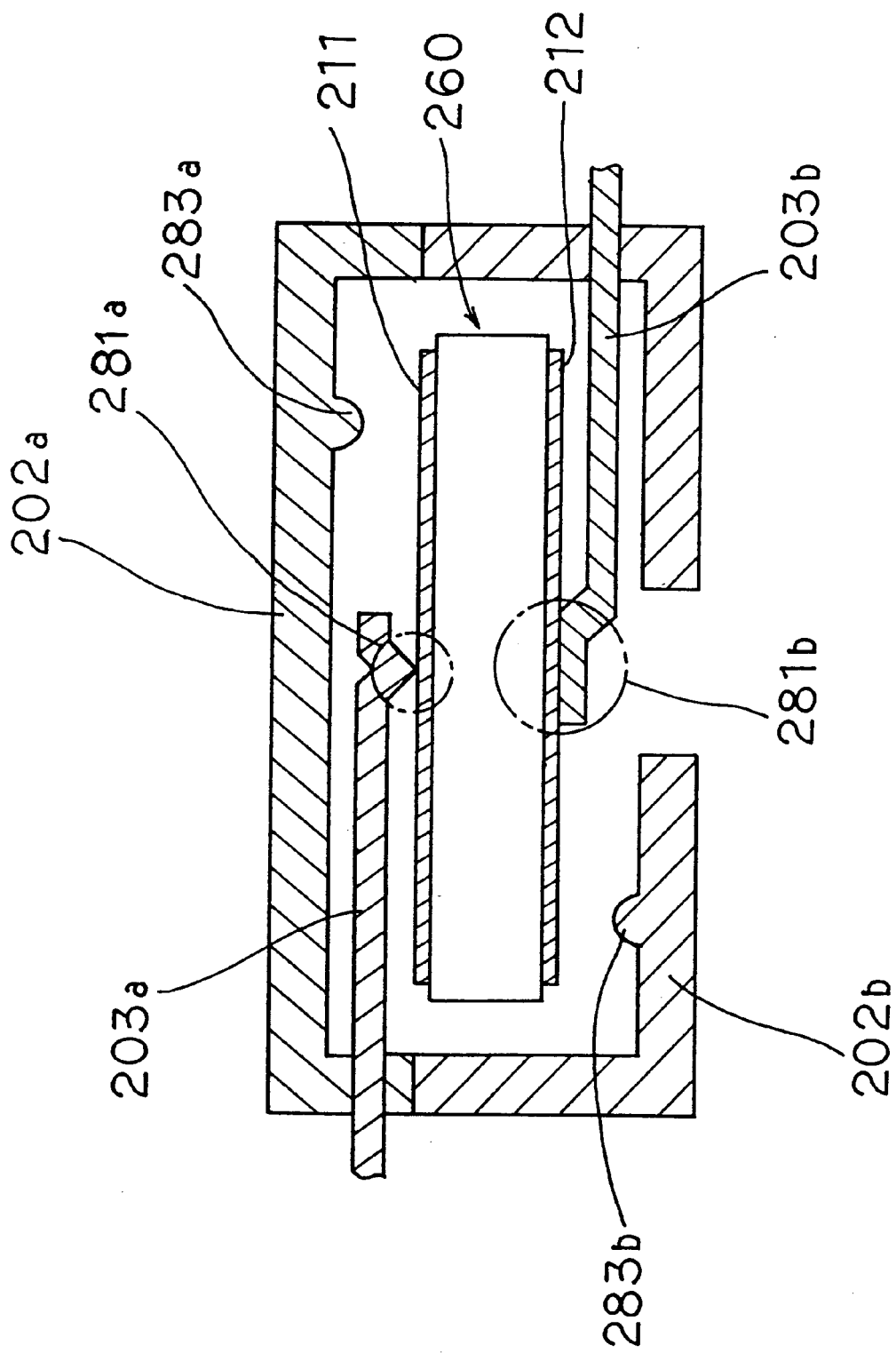
FIG. 3 is a cross sectional view of the piezoelectric transformer shown in FIG. 2.
Figure 4:
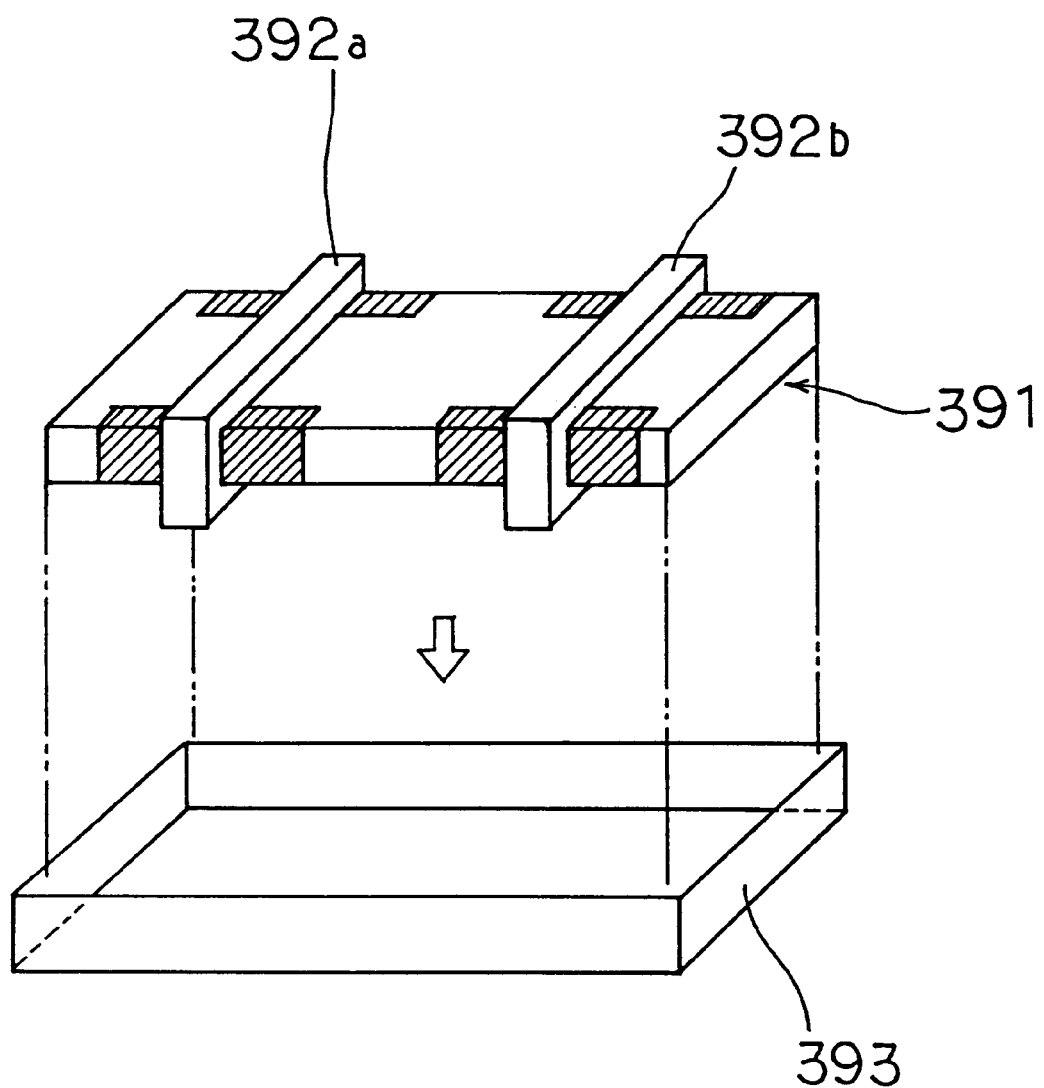
FIG. 4 is an exploded perspective view showing the prior-art piezoelectric transformer.
Figure 5:
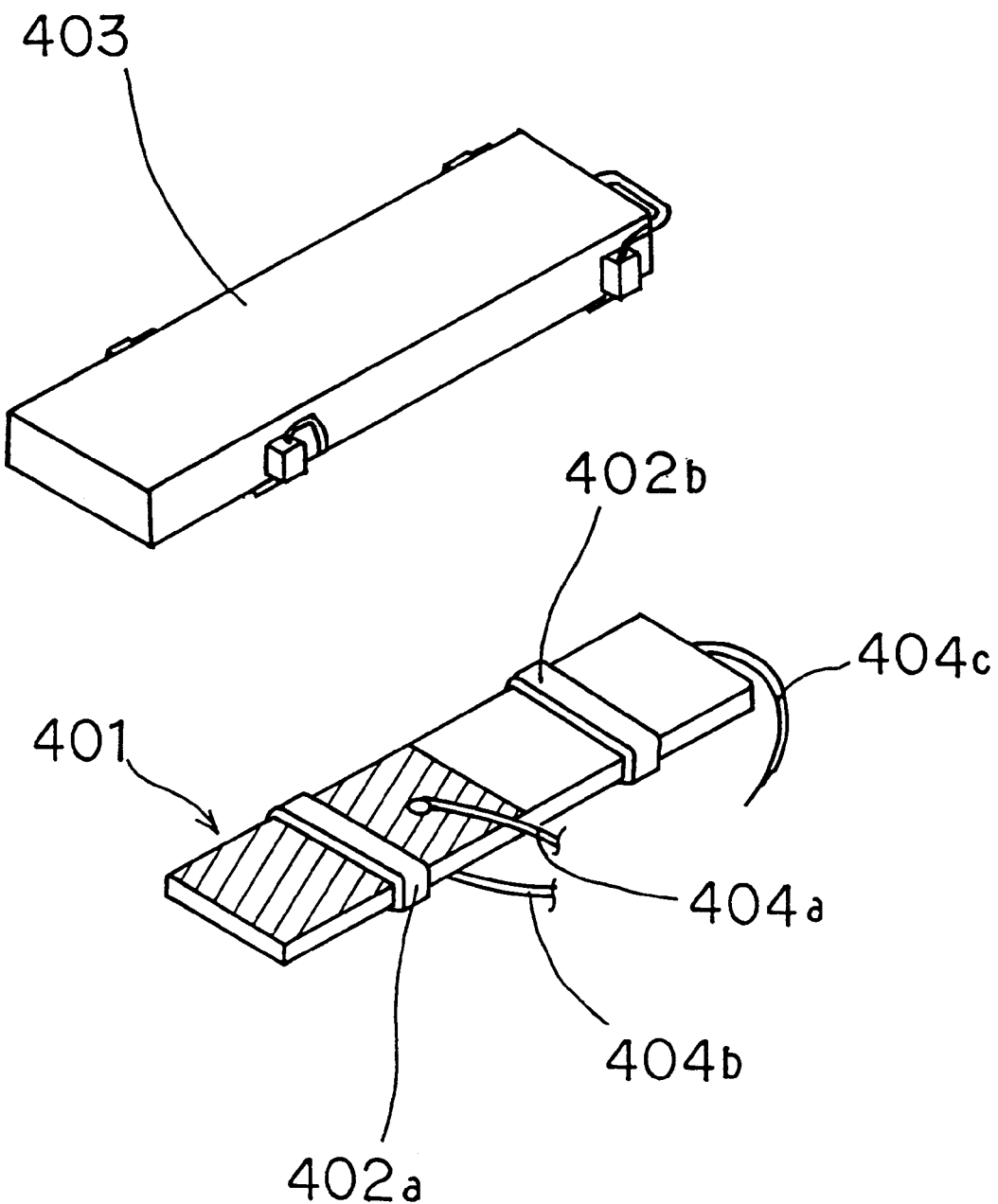
FIG. 5 is an exploded perspective view showing the prior-art piezoelectric transformer.
Figure 6:
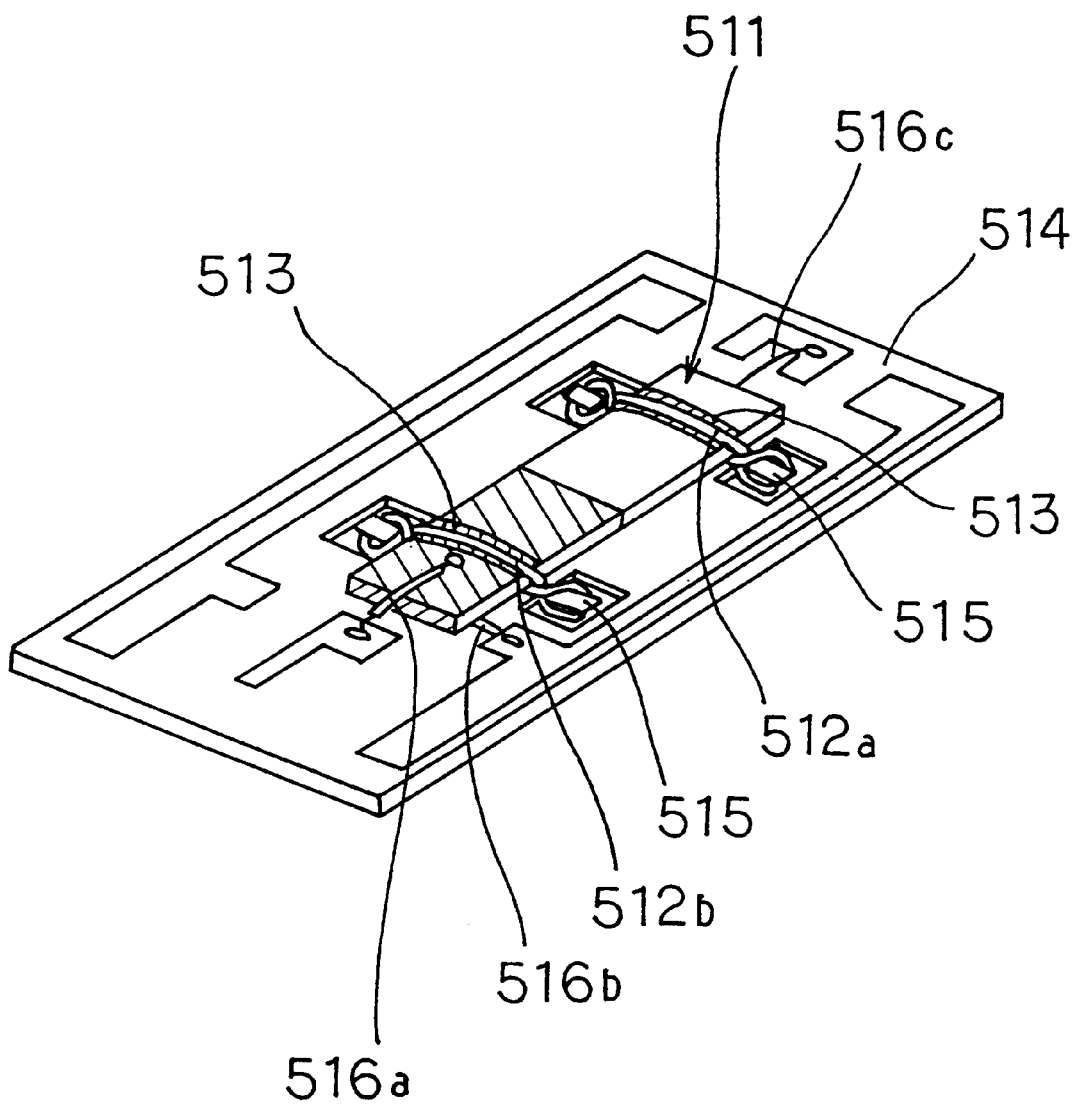
FIG. 6 is a perspective view showing the prior-art piezoelectric transformer.
Figure 7:
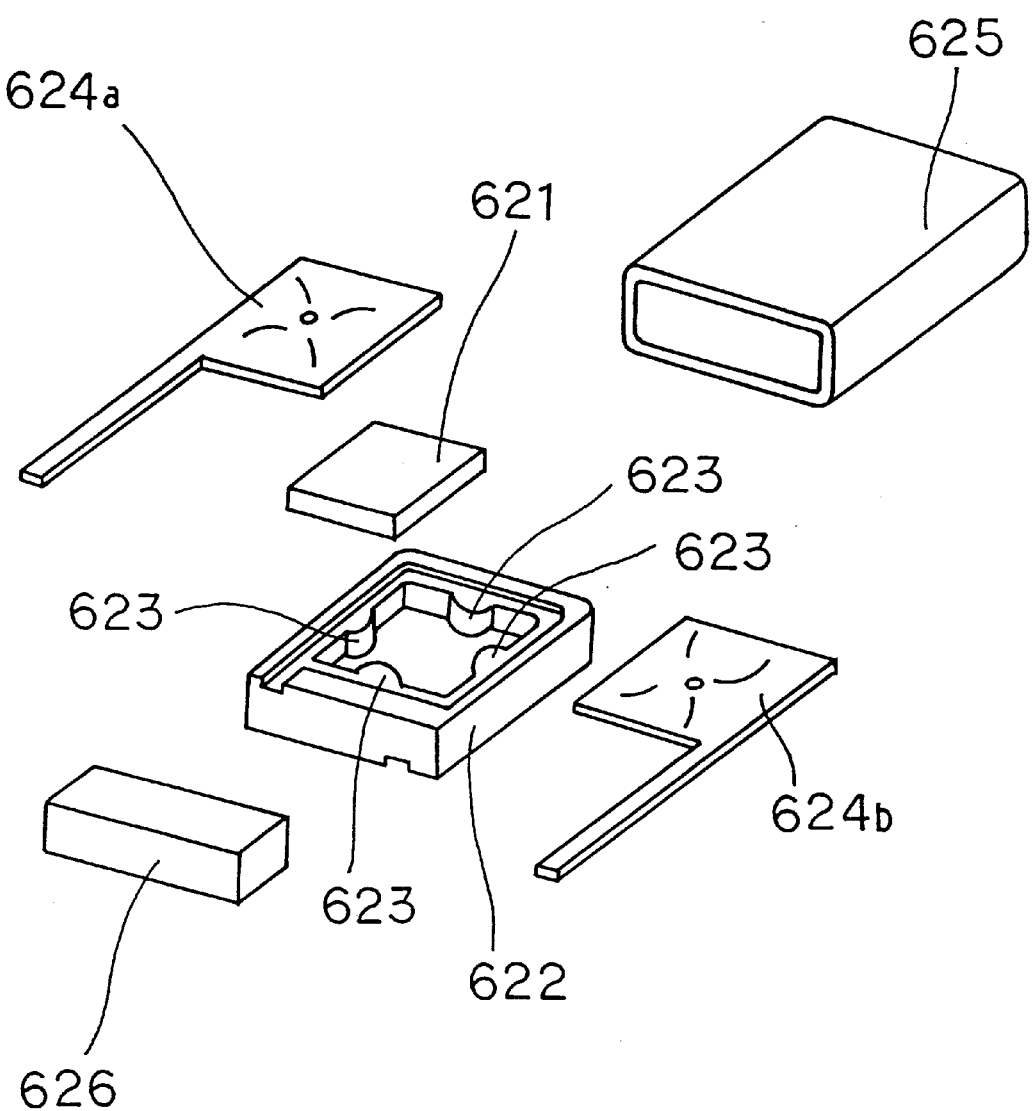
FIG. 7 is an exploded perspective view showing the prior-art piezoelectric transformer.

First, when the noise level was measured, in the piezoelectric transformer of this embodiment, the noise was of a background level. On the other hand, in the prior art shown in FIG. 2, noise is generated at a level a few dB to 10 dB higher than the background level, and the ratio of generation of noise is about 30%.

Next, when the electrical characteristics were evaluated, energy conversion efficiency was 94% or more. The piezoelectric transformer of this embodiment is not significantly different from the conventional piezoelectric transformer in which the piezoelectric transformer element is held by the lead terminals alone. An excellent result was obtained.

Subsequently, the vibration and impact tests were carried out to evaluate the strength for holding the piezoelectric transformer.

The vibration test was carried out in the following manner. Under the conditions in which one cycle is assumed to be a vibration whose frequency is changed from 15 Hz to 1 kHz at an acceleration of 3 G and the test is performed for two hours (120 cycles) each, namely, with 1 cycle/min, in X, Y and Z directions of the piezoelectric transformer, 20 samples of the piezoelectric transformer were tested. The measurement of noise level and the electrical characteristics after the vibration test were not different from initial values before the vibration test. An excellent result was obtained.

The impact test was carried out in the following fashion. Under the conditions in which an impact is applied to the piezoelectric transformer 10 times from each the ±X, Y and Z directions of the piezoelectric transformer at acceleration of 100 G (where impact time is about 10 msec), 20 samples of the piezoelectric transformer were tested. The noise level and the electrical characteristics after the impact test were not different from the initial values prior to the impact test. An excellent result was obtained.

Consequently, it is possible to realize a piezoelectric transformer which is reliable enough to resist the external force applied to the piezoelectric transformer.

A test in which the piezoelectric transformer is allowed to stand at a high temperature, a test in which the piezoelectric transformer is allowed to stand at a low temperature, a high-temperature operation test and a thermal shock test were also performed to evaluate the reliability (where the number of samples was 20 each). In these tests there were no problems such as increase in noise level and decrease in energy conversion efficiency in a piezoelectric transformer. It is also possible to realize a piezoelectric transformer which reliable enough to resist change in the environment.

Moreover, a piezoelectric transformer of the same constitution was evaluated changing the hardness of the silicon-family rubber material of ring-shaped elastic body 4. When the hardness was 30–50° (in conformity with JIS K 6253), an excellent result was obtained in the same manner as described above. However, when the hardness was less than 30° (in conformity with JIS K 6253), piezoelectric transformer element 1 was positionally shifted by external force in the vibration or impact test, and thus the noise level sometimes increased after the test. This is because the rubber material of ring-shaped elastic body 4 is softened and thus the strength for holding piezoelectric transformer element 1 is weakened.

On the contrary, when the hardness is more than 50° (in conformity with JIS K 6253), the energy conversion efficiency is decreased to 90% or less. This is because the rubber material of ring-shaped elastic body 4 is hardened and thus the force for pressing piezoelectric transformer element 1 is increased.

Additionally, the piezoelectric transformer was evaluated by changing width $q_1$ of ring-shaped elastic body 4. When width $q_1$ is within a range of 1 mm to 2 mm, an excellent result was obtained in the same manner as described above. However, when width $q_1$ is less than 1 mm, the noise level sometimes increased after the test. This is because the holding strength of ring-shaped elastic body 4 is reduced and thus piezoelectric transformer element 1 is positionally shifted by external force in the vibration or impact test. On the contrary, when width $q_1$ exceeds 2 mm, the energy conversion efficiency is greatly decreased, becoming less than 90%. This is because the vibration of piezoelectric transformer element 1 is inhibited.

The position at which ring-shaped elastic body 4 is mounted to piezoelectric transformer element 1 was then evaluated by mounting ring-shaped elastic body 4 at a position more than 3 mm away from the node position of vibration. In this case, the energy conversion efficiency is decreased to less than 90%.

Instead of the silicon-family rubber material used as the material of ring-shaped elastic body 4, urethane-family and Teflon-family rubber materials were used as the material of ring-shaped elastic body 4 and the piezoelectric transformer was evaluated as described above. The same result as was obtained as when using silicon-family rubber material.

Embodiment 2

Figure 12:
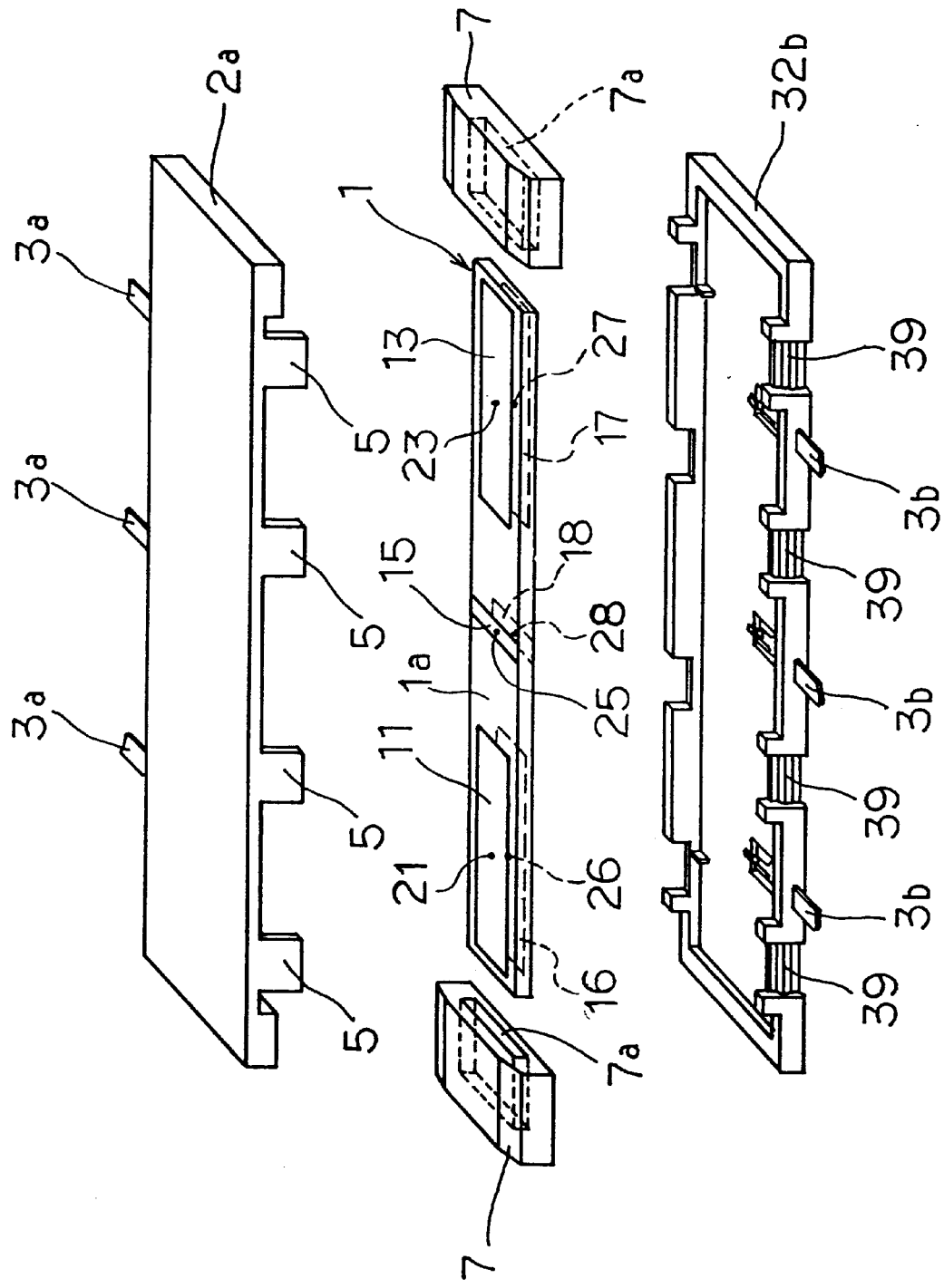
FIG. 12 is an exploded perspective view showing the piezoelectric transformer of a second embodiment of the present invention.

The piezoelectric transformer of the second embodiment of the present invention differs from the piezoelectric transformer of the first embodiment in the elastic body used for holding the piezoelectric transformer element and a part of the case for housing the piezoelectric transformer element therein. In FIG. 12, the same components as the first embodiment have the same reference numerals. The main difference between the first and second embodiments will be described below.

Referring to FIG. 12, in the piezoelectric transformer of this embodiment, piezoelectric transformer element 1 is held within the case by holder-shaped elastic bodies 7 mounted on both ends of piezoelectric transformer element 1. Concavities 7a, in which the ends of piezoelectric transformer element 1 are inserted, are formed in holder-shaped elastic bodies 7. The ends of piezoelectric transformer element 1 are inserted in concavities 7a, whereby holder-shaped elastic bodies 7 are mounted to piezoelectric transformer element 1.

Lower case 32b is different from lower case 2b for use in the first embodiment only in that positioning grooves 6 formed in lower case 2b are not formed in lower case 32b. Other shapes and dimensions of lower case 32b are the same as the shapes and dimensions of lower case 2b. Protrusions 39 of lower case 32b are also shaped in the same manner as protrusions 9 of lower case 2b. Therefore, snap fit fingers 5 of upper case 2a are fitted to protrusions 39.

Figure 13:
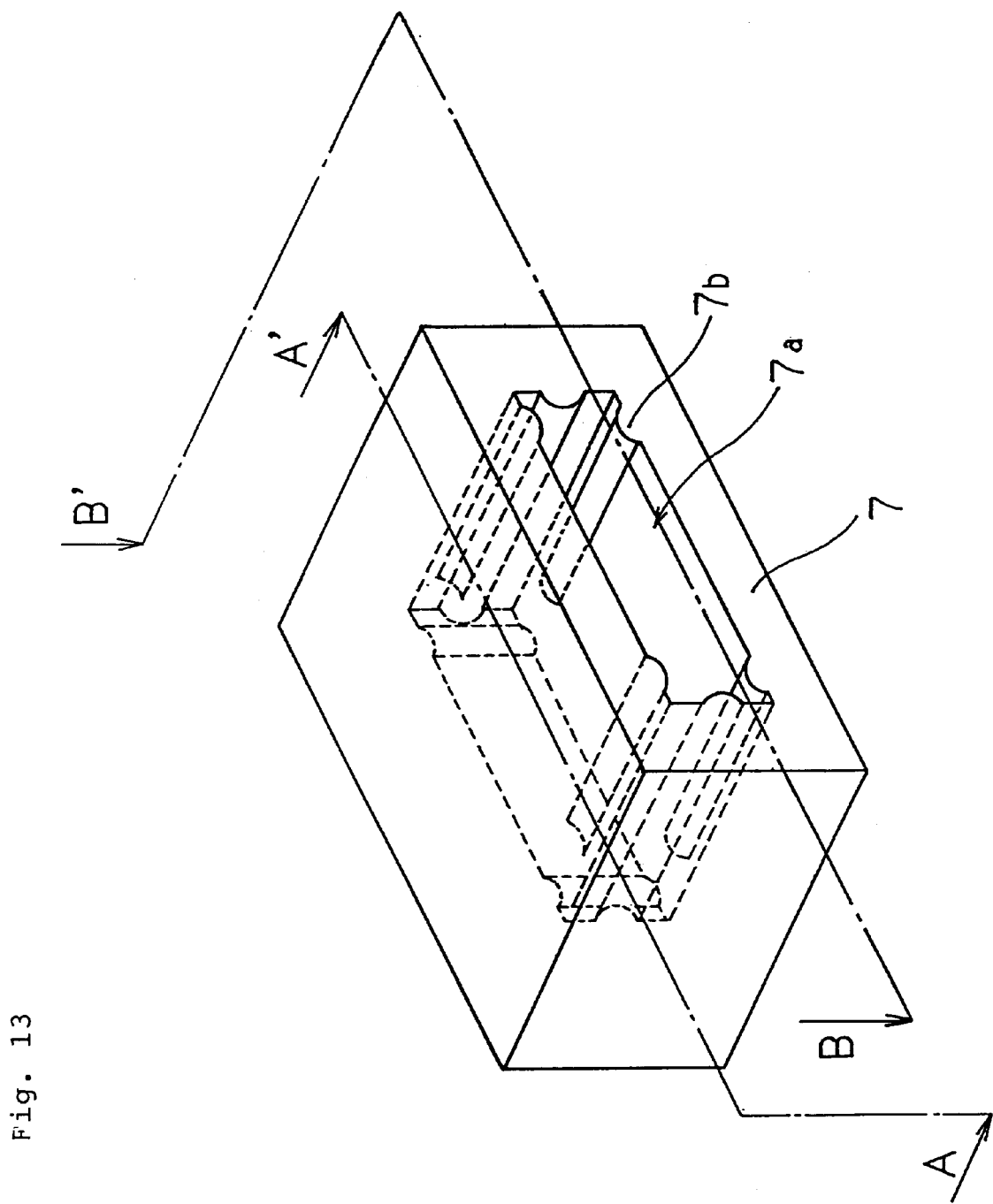
FIG. 13 is a perspective view showing a holder-shaped elastic body shown in FIG. 12.

Referring to FIG. 13, semi-cylindrically extruded convexities 7b are formed on the inner walls on the bottom and side surfaces of concavity 7a formed in holder-shaped elastic body 7.

Figure 14A:
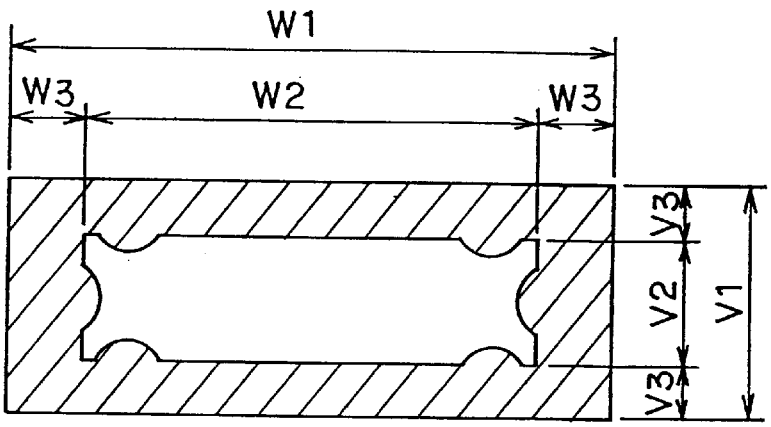
FIG. 14A is a cross sectional view taken on line A-A' of FIG. 13.
Figure 14B:
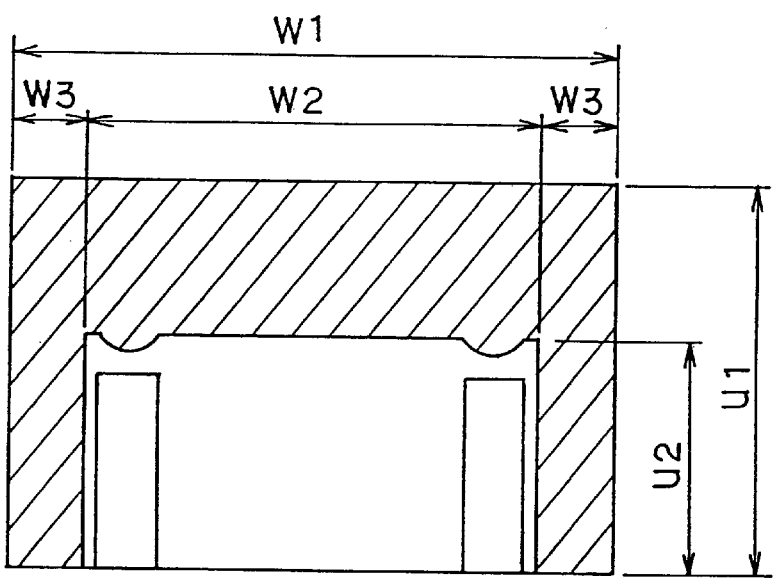
FIG. 14B is a cross sectional view taken on line B-B' of FIG. 13.

Referring to FIGS. 14A and 14B, the external dimensions of holder-shaped elastic body 7 are $w_1=9.5$ mm in width, $v_1=2$ mm in height and $u_1=5$ mm in length. Concavity 7a in which piezoelectric transformer element 1 is inserted is shaped so that it may have width $w_2$ of 5.5 mm, height $v_2$ of 1 mm and depth $u_2$ of 3 mm. Concavity 7a has thickness $w_3$ of 2 mm in a width direction and thickness $v_3$ of 0.5 mm in a height direction. The silicon-family rubber material is used as the material of holder-shaped elastic body 7, and the hardness of the silicon-family rubber material is 30° in conformity with JIS (Japanese Industrial Standards) K 6253.

Figure 14C:
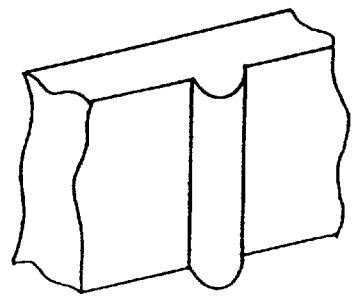
FIGS. 14C and 14D are perspective views for describing the shape of a convexity formed within the holder-shaped elastic body shown in FIG. 13.

Semi-cylindrical convexity 7b shown in FIG. 14C is also formed on the inner wall of concavity 7a in which piezoelectric transformer element 1 is inserted. Instead of convexity 7b, a hemispherical convexity shown in FIG. 14D may be formed on the inner wall of concavity 7a.

Convexity 7b is formed in the position described below. That is, when piezoelectric transformer element 1 is inserted in concavity 7a, the convexity formed on the side surface opposite to the front or rear surface of piezoelectric transformer element 1 is formed so that a distance between the end of the convexity near the bottom surface of concavity 7a and the bottom surface of concavity 7a may be 2 mm or less. Moreover, when piezoelectric transformer element 1 is inserted in concavity 7a, the convexity formed on the side surface opposite to the side surface of piezoelectric transformer element 1 is formed so that it may pass through the center of the side surface of concavity 7a and extend parallel to the front and rear surfaces of piezoelectric transformer element 1. In addition, the convexity formed on the bottom surface of concavity 7a is positioned in the following manner. That is, when piezoelectric transformer element 1 is inserted in concavity 7a, the convexity is formed so that the distance from the side surface opposite to the side surface of piezoelectric transformer element 1 to the convexity may be within a range of 2 mm or less.

Convexities 7b formed on the inner wall surfaces of concavity 7a are sized so that they may be semi-cylinders, each having a radius of 0.3 mm.

For the above-described piezoelectric transformer of the second embodiment, in the same manner as the piezoelectric transformer of the first embodiment, a noise level evaluation, an electrical characteristics evaluation, vibration and impact tests and the reliability evaluation were performed. The same excellent results were obtained as in the piezoelectric transformer of the first embodiment.

More specifically, the piezoelectric transformer of the second embodiment is superior to that of the first embodiment in that the energy conversion efficiency of piezoelectric transformer element 1 is improved and the energy conversion efficiency is increased up to 95% or more.

Moreover, the piezoelectric transformer was evaluated by changing the hardness of the silicon-family rubber material used as the material of holder-shaped elastic body 7. When the hardness is 30–50° (in conformity with JIS K 6253), the same excellent result as described above is obtained. However, when the hardness is less than 30° (in conformity with JIS K 6253), the energy conversion efficiency of the piezoelectric transformer sometimes decreases to 90% or less. This is because the rubber material of holder-shaped elastic body 7 is softened whereby convexity 7b on the inner wall of concavity 7a is deformed by the external force in the vibration or impact test and thus the vibration of piezoelectric transformer element 1 is inhibited.

On the contrary, when the hardness is more than 50° (in conformity with JIS K 6253), the energy conversion efficiency is sometimes decreased to 90% or less. This is because the rubber material is hardened and thus the force for pressing piezoelectric transformer element 1 is increased.

Furthermore, the piezoelectric transformer was evaluated by changing depth $u_2$ of concavity 7a of holder-shaped elastic body 7. When depth $u_2$ is within a range of 3 mm or less, an excellent result is obtained in the same manner as described above. However, when depth $u_2$ is more than 3 mm, the energy conversion efficiency of the piezoelectric transformer is decreased to less than 90%. This is because the vibration of piezoelectric transformer element 1 is inhibited.

Furthermore, the piezoelectric transformer was evaluated changing the position at which convexity 7b of holder-shaped elastic body 7 is formed. The convexity formed on the side surface of concavity 7a was formed so that the distance between the end of the convexity near the bottom surface of concavity 7a and the bottom surface of concavity 7a was 2 mm or more. In addition, the convexity formed on the bottom surface of concavity 7a was formed so that the distance between the end of the convexity near the side surface of concavity 7a and the side surface of concavity 7a was 2 mm or more. In this case, the energy conversion efficiency is decreased and consequently is less than 90%.

Furthermore, the piezoelectric transformer was evaluated using a holder-shaped elastic body in which semi-cylindrical convexity 7b was sized so that the radius of the semi-cylinder of convexity 7b was more than 0.3 mm. As a result, the vibration of piezoelectric transformer element 1 is inhibited, and thus the energy conversion efficiency of the piezoelectric transformer is reduced.

Figure 14D:
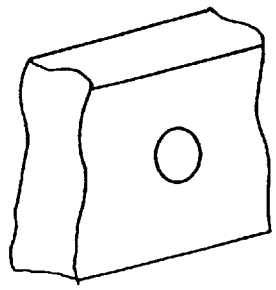

Furthermore, the piezoelectric transformer was evaluated using a holder-shaped elastic body in which the hemispherical convexity shown in FIG. 14D was formed on the inner wall of concavity 7a so that the radius of the hemisphere of the convexity was 0.3 mm. The result obtained was the same as in the use of holder-shaped elastic body 7 in which semi-cylindrical convexity 7b of the radius of 0.3 mm was formed. However, when the radius of the hemisphere of the convexity is more than 0.3 mm, the vibration of piezoelectric transformer element 1 is inhibited, and thus the energy conversion efficiency of the piezoelectric transformer is reduced.

The piezoelectric transformer was evaluated in the same manner as described above using urethane-family and Teflon-family rubber materials as the material of holder-shaped elastic body 7 instead of the silicon-family rubber material used as the material of holder-shaped elastic body 7. The same result as in the use of the silicon-family rubber material was obtained.

While preferred embodiments of the present invention have been described using specific terms, such description is for illustrative purposes only, and it is to be understood that changes and variations may be made without departing from the spirit or scope of the following claims.

What is claimed is:

1. A piezoelectric transformer comprising:
   a piezoelectric transformer element including electrodes formed on a piezoelectric body;
   a case in which said piezoelectric transformer element is housed; and
   at least one holder-shaped elastic body, having a concavity in which an end of said piezoelectric transformer element is inserted, for holding said piezoelectric transformer element within said case,
   wherein a plurality of convexities are formed on side and bottom surfaces inside said concavity of said at least one holder-shaped elastic body.

2. The piezoelectric transformer according to claim 1, wherein said electrodes are formed on an area of the front surface and the rear surface of said piezoelectric body, said piezoelectric transformer further comprising:
   first lead terminals included in said case for pressing the electrodes on the front surface of said piezoelectric body in order to hold said piezoelectric body and for being electrically connected to the electrodes on the front surface of said piezoelectric body;
   second lead terminals included in said case for pressing the electrodes on the rear surface of said piezoelectric body in order to hold said piezoelectric body and for being electrically connected to the electrodes on the rear surface of said piezoelectric body.

3. The piezoelectric transformer according to claim 1, wherein said at least one ring-shaped elastic body has a width of 1–2 mm in a direction in which said piezoelectric transformer element is inserted in said ring-shaped elastic body.

4. The piezoelectric transformer according to claim 2, wherein said piezoelectric transformer element is held by said first and second lead terminals on a node position of vibration of said piezoelectric transformer element, and said piezoelectric transformer element is further held by at least one ring-shaped elastic body so that a distance from the node position of vibration of said piezoelectric transformer element to said at least one ring-shaped elastic body is within a range of 3 mm or less.

5. The piezoelectric transformer according to claim 1, wherein said concavity of said at least one holder-shaped elastic body has a depth of 3 mm or less.

6. The piezoelectric transformer according to claim 1, wherein said convexity formed inside said concavity of said at least one holder-shaped elastic body is positioned in the following manner:
   when said piezoelectric transformer element is inserted in said concavity, the convexity formed on the side surface inside the concavity opposite to the front and rear surfaces of said piezoelectric body is positioned so that the distance from the bottom surface of said concavity to the convexity is 2 mm or less; and
   when said piezoelectric transformer element is inserted in said concavity, the convexity formed on the bottom surface of said concavity is positioned so that the distance from the side surface inside said concavity opposite to the side surface of said piezoelectric body to the convexity is 2 mm or less.

7. The piezoelectric transformer according to claim 1, wherein said plurality of convexities formed in said concavity of said at least one holder-shaped elastic body are shaped into semi-cylinders having a radius of 0.3 mm or less.

8. The piezoelectric transformer according to claim 1, wherein the hardness of said at least one holder-shaped elastic body is 30–50° in conformity with JIS (Japanese Industrial Standards) K 6253.

9. The piezoelectric transformer according to claim 8, wherein a material of said at least one holder-shaped elastic body is a silicon-family, urethane-family or Teflon-family rubber material.

10. The piezoelectric transformer according to claim 1, wherein the external dimensions of said piezoelectric transformer element are 42 mm in length, 5.5 mm in width and 1 mm in thickness.

11. The piezoelectric transformer according to claim 1, wherein said plurality of convexities formed in said concavity of said at least one holder-shaped elastic body are shaped into hemispheres having a radius of 0.3 mm or less.

12. The piezoelectric transformer according to claim 1, wherein said piezoelectric body is a long-plate shaped piezoelectric body.

* * * * *